United States Patent
Vaeth et al.

[11] Patent Number: 5,869,135
[45] Date of Patent: Feb. 9, 1999

[54] SELECTIVE CHEMICAL VAPOR DEPOSITION OF POLYMERS

[75] Inventors: Kathleen M. Vaeth, Webster, N.Y.; Klavs F. Jensen, Lincoln, Mass.

[73] Assignee: Massachusetts Institute of Technology, Cambridge, Mass.

[21] Appl. No.: 909,690

[22] Filed: Oct. 3, 1997

[51] Int. Cl.⁶ .................................................. C23C 16/04
[52] U.S. Cl. .................. 427/255; 427/255.6; 427/256; 427/259; 427/261; 427/287; 427/301; 427/304; 427/327
[58] Field of Search ................................ 427/255, 255.6, 427/256, 259, 261, 287, 301, 304, 327

[56] References Cited

U.S. PATENT DOCUMENTS

| | | | |
|---|---|---|---|
| 3,900,600 | 8/1975 | Spaulding | 427/99 |
| 4,299,866 | 11/1981 | Clark et al. | 427/255.6 |
| 4,710,401 | 12/1987 | Warren, Jr. et al. | 427/255.6 |
| 5,250,319 | 10/1993 | Ohsako | 427/255.6 |
| 5,512,131 | 4/1996 | Kumar et al. | 156/655.1 |
| 5,618,379 | 4/1997 | Armacost et al. | 438/595 |

OTHER PUBLICATIONS

Grenier et al, "Poly(p–xylylene)s: Synthesis, polymer analogous reactions, and perspectives on structure–property relationships," *Acta Polymer* 48:1–15 (Feb. 1997).

Huang et al, "Selective deposition of films of polypyrrole, polyaniline, and nickel on hydrophobic/hydrophilic patterned surfaces and applications," *Synthetic Metals* 85:1375–1376 (Feb. 15, 1997).

Iwatsuki et al, "New Method for Preparation of Poly(phenylene–vinylene) Film," *Chemistry letters* 1991:1071–1074 (1991—Month unavailable and not in issue).

Schäfer et al, "Poly(p–phenylenevinylene) by chemical vapor deposition: synthesis, structural evaluation, glass transition, electroluminescence, and phonoluminescence," *Synthetic Metals* 82:1–9 (Aug. 30, 1996).

Sekguchi, et al, "Micrometer patterning of phthalocyanines by selective chemical vapor deposition," *Appl. Phys. Lett.* 59(19):2466–2468 (Nov. 1991).

Staring et al, "Chemical vapour deposition of poly(1,4–phenylenevinylene) films," *Synthetic Metals* 67:71–75 (1994—Month unavailable and not in issue).

Tatsuura et al, "Polyazomethine conjugated polymer film with second order nonlinear optical properties fabricated by electric–field–assisted chemical vapor deposition," *Applied Physics Letters* 62(18):2182–2184 (May 1993).

Vaeth et al, "Chemical Vapor Deposition of Thin Polymer Films Used in Polymer–Based Light Emitting Diodes," *Advanced Materials* 9(6):490–493 (May 1997).

Vaeth et al, "Chemical vapor deposition of poly(p–phenylene vinylene) based light emitting diodes with low turn–on voltages," *Applied Physics Letters* 77 (Nov. 1997).

Weaver et al, "Organic electroluminescence devices fabricated with chemical vapour deposited polyazomethine films," *Synthetic Methals* 83:61–66 (Oct. 1996).

Wen et al, "Single–layer organic electroluminescent devices by vapor deposition polymerization," *Applied Physics Letters* 71(10):1302–1304 (Sep. 1997).

*Primary Examiner*—Shrive Beck
*Assistant Examiner*—Timothy Meeks
*Attorney, Agent, or Firm*—Choate, Hall & Stewart; Sam Pasternack

[57] ABSTRACT

A system for selective chemical vapor deposition of polymers onto a substrate. A substrate is provided which comprises a plurality of surface regions, wherein the surface of at least one region provides a more favorable nucleation site for at least one of a polymer or polymer precursor than at least one other region. This may be an intrinsic characteristic of the substrate or may be accomplished through surface treatment of a substrate. The substrate is subjected to chemical vapor deposition of a reactive monomer, producing a polymer coating which is substantially thicker in the regions of favorable nucleation than in the regions of unfavorable nucleation.

21 Claims, 4 Drawing Sheets

SELECTIVE CHEMICAL VAPOR DEPOSITION OF POLYMERS

This invention was made with government support under Grant Number N00014-95-1-0693 awarded by the Office of Naval Research. The government has certain rights in the invention.

FIELD OF THE INVENTION

The present invention relates to the selective deposition of polymers and polymer precursors by chemical vapor deposition onto a substrate, such as a surface of a semiconductor device.

BACKGROUND OF THE INVENTION

It is often desired to produce a conformal polymer coating on selected areas of a substrate. Conventional methods for producing such a coating generally involve solution processing to achieve a substantially uniform layer of polymer over the entire substrate surface, followed by removing selected areas by photolithography. However, uniform coating followed by photolithography is not a suitable process for selective deposition of many polymers, since it involves use of solvents, acids, and water, all of which can lead to undesirable side reactions with the deposited polymer.

Prominent among the polymers for which photolithography processes are undesirable are electroluminescent (EL) polymers. These materials are promising for use as the active element in light emitting diodes (LEDs) and lasers, since polymers have advantages in processing and formation of strong, flexible, light weight structures. Some of the most attractive candidates for polymer-based LEDs are those derived from poly(p-phenylene vinylene) (PPV). Continuous thin films of PPV can be fabricated by solution processing methods, or by chemical vapor deposition. However, production of devices more complicated than a single monolithic LED requires subsequent photolithography, which can irreparably damage the unique electronic properties of these films. In particular, the incorporation of oxygen into the structure of PPV has been shown to be detrimental to the conductivity and to the photoluminescent (PL) and EL efficiencies of the film, through the formation of carbonyl defects.

It is thus desirable to produce patterned layers of polymer coatings directly, in which the polymer is selectively deposited only on the areas in which it is ultimately desired. For inorganic materials, it has been found that such selective deposition can be accomplished by a surface treatment of a substrate followed by chemical vapor deposition. The surface treatment is adapted to inhibit nucleation in some areas of the substrate, and/or to promote nucleation in other areas. By carefully controlling the processing conditions of the chemical vapor deposition, the inorganic material can be induced to deposit only on the favorable nucleation areas, producing a patterned layer of material.

A similar process is described in U.S. Pat. No. 5,618,379, in which exposure of selected areas of a substrate to a plasma inhibits the subsequent deposition of p-xylylene monomers to produce poly-p-xylylene in those areas. However, the use of a plasma is cumbersome and not suitable for all substrates, and no methods are disclosed for deposition of polymers other than poly-p-xylylene. In particular, no techniques are known for the selective deposition of PPV and its related compounds without subsequent solution processing.

SUMMARY OF THE INVENTION

In one aspect, the invention comprises a method for selectively inhibiting the growth by chemical vapor deposition of a polymer or polymer precursor on a substrate. The method is characterized by a surface treatment of the substrate which is adapted to inhibit nucleation of the material to be deposited, where this method involves surface treatments other than plasma processing. In a preferred embodiment, the surface treatment comprises the deposition of self-assembled monolayers (SAMs), optionally followed by solution processing for the purpose of ion exchange of at least a portion of the monolayers.

Another aspect of the invention relates to a method for selectively inhibiting the growth by chemical vapor deposition of an EL polymer precursor on a substrate by treating the surface of the substrate. In a preferred embodiment, the precursor is a precursor of PPV. In another preferred embodiment, the surface treatment comprises exposure of the substrate to metal shavings or metal salts. In a further preferred embodiment, these metal shavings or salts are selected from the group consisting of iron shavings, iron sulfate, copper sulfate, or silver sulfate.

In another aspect, the invention comprises a method for selectively enhancing the growth by chemical vapor deposition of a polymer or polymer precursor on a substrate, characterized by a surface treatment of the substrate. The surface treatment is adapted to promote nucleation of the material to be deposited. By way of example, it has been found that the deposition of PPV is enhanced by a monolayer of COOH on the substrate surface, and by polymer primer layers such as poly(vinyl carbazole).

A further aspect of the invention comprises using selective inhibition and/or selective enhancement of deposition to construct an electronic device comprising EL polymers. In this aspect, a substrate is selectively treated with at least one of a process adapted to promote nucleation of an EL polymer precursor or a process adapted to inhibit nucleation of an EL polymer precursor. The treated substrate is then subjected to chemical vapor deposition of the precursor, ultimately producing a patterned layer of an EL polymer.

Another aspect of the invention comprises a substrate coated with at least one of an EL polymer precursor and an EL polymer, in which the coating is substantially free of oxygen. One method of producing such a substrate is by means of chemical vapor deposition of an EL polymer precursor onto a substrate which has undergone surface treatment adapted to create regions of greater and lesser susceptibility to nucleation of the precursor.

A further aspect of the invention comprises a method of selectively coating a substrate with an EL polymer precursor without the immersion of the substrate into a liquid solution during the coating process, and the substrate so selectively coated. It is particularly intended that "during the coating process" shall include any steps of removing portions of a coating from a surface, for example by photolithography following a nonselective coating process.

Yet another aspect of the invention comprises a method of combining EL polymer layers and either organometallic layers, organic dyes, or a combination thereof onto a single substrate. This method involves the selective chemical vapor deposition of polymer precursors and organometallic substances without subsequent solution processing. In a related aspect, the invention comprises a substrate selectively coated with a EL polymer and either organometallic layers, organic dyes, or a combination thereof, where this coating has been accomplished by chemical vapor deposition.

In still another aspect, the invention comprises a substrate, intended for chemical vapor deposition of a polymer or polymer precursor thereon, which comprises a plurality of regions, wherein at least one region of the substrate is more favorable for nucleation of the polymer or polymer precursor than another region.

By "selective coating," as that term is used herein, it is meant that the technique or object described is characterized by regions which have been coated with some material, and regions which have either not been so coated, or have been coated to a substantially lesser extent. Similarly, "selective inhibition" implies that only a portion of regions on a surface are subject to inhibition, and "selective enhancement" implies that only a portion of the regions on a surface are subject to enhancement.

By "patterned layer," as that term is used herein, it is meant a layer which is characterized by defined regions of a plurality of thicknesses, where some such regions may be of zero thickness (i.e., the layer may contain holes).

By "solution processing," as that term is used herein, it is meant the set of techniques which require immersion in a liquid solution or application of a liquid solution to a surface. By way of example, both spin coating and dip coating are solution processing techniques.

BRIEF DESCRIPTION OF THE DRAWING

The invention is described with reference to the figures, which are presented for the purpose of illustration only, and in which.

DETAILED DESCRIPTION

In its preferred embodiments, the process of the invention comprises two main steps. First, a substrate with a suitable surface is provided. Surfaces that have been found to be particularly efficacious for the practice of this invention include, but are not limited to, indium-tin oxide (ITO), glass, silicon, silver, gold, and aluminum. Second, this surface is subjected to chemical vapor deposition of a polymer or polymer precursor. A number of other processing steps may be included before, after, or between these steps in order to produce a desired product. For example, to form a patterned layer of PPV, a precursor of PPV is deposited in accordance with the described steps, and then that layer is subjected to a thermal treatment designed to convert the precursor into PPV.

In its first step, a substrate having preferred surface characteristics must be provided. In the preferred embodiments, this is accomplished by treatment of the surface of the substrate by various chemical and mechanical means. In other embodiments, the substrate may possess the desired surface characteristics by virtue of its inherent composition. For example, the substrate may be a composite, whereby different regions of the surface have differing compositions, and thus different affinities for the polymer or polymer precursor to be deposited. In another example, different crystallographic surfaces of the substrate may have differing affinities for the material to be deposited, allowing deposition of a patterned layer.

The preferred embodiments comprise a wide variety of surface treatments. In one embodiment, a substrate is scraped with a metal tool such as a razor blade. In another embodiment, a uniform coating of an organic precursor is deposited on a substrate, and that coating is transformed into a patterned layer by means of photolithography. Yet another embodiment comprises the deposition of a self-assembled patterned monolayer on the surface of the substrate, for example by stamping. Still other embodiments comprise exposure of the substrate surface to metal shavings or metal salts. Other embodiments are contemplated in which the substrate is selectively exposed to plasmas, various forms of electromagnetic radiation, or to electron beams, or in which the substrate is selectively mechanically deformed, to produce a surface divided into regions, in which nucleation of the polymer or polymer precursor to be deposited is more favorable on at least one region than on another. The reader is directed to the Examples immediately following the Detailed Description for descriptions of some surface treatments which have been found to be particularly efficacious.

Figure 1:
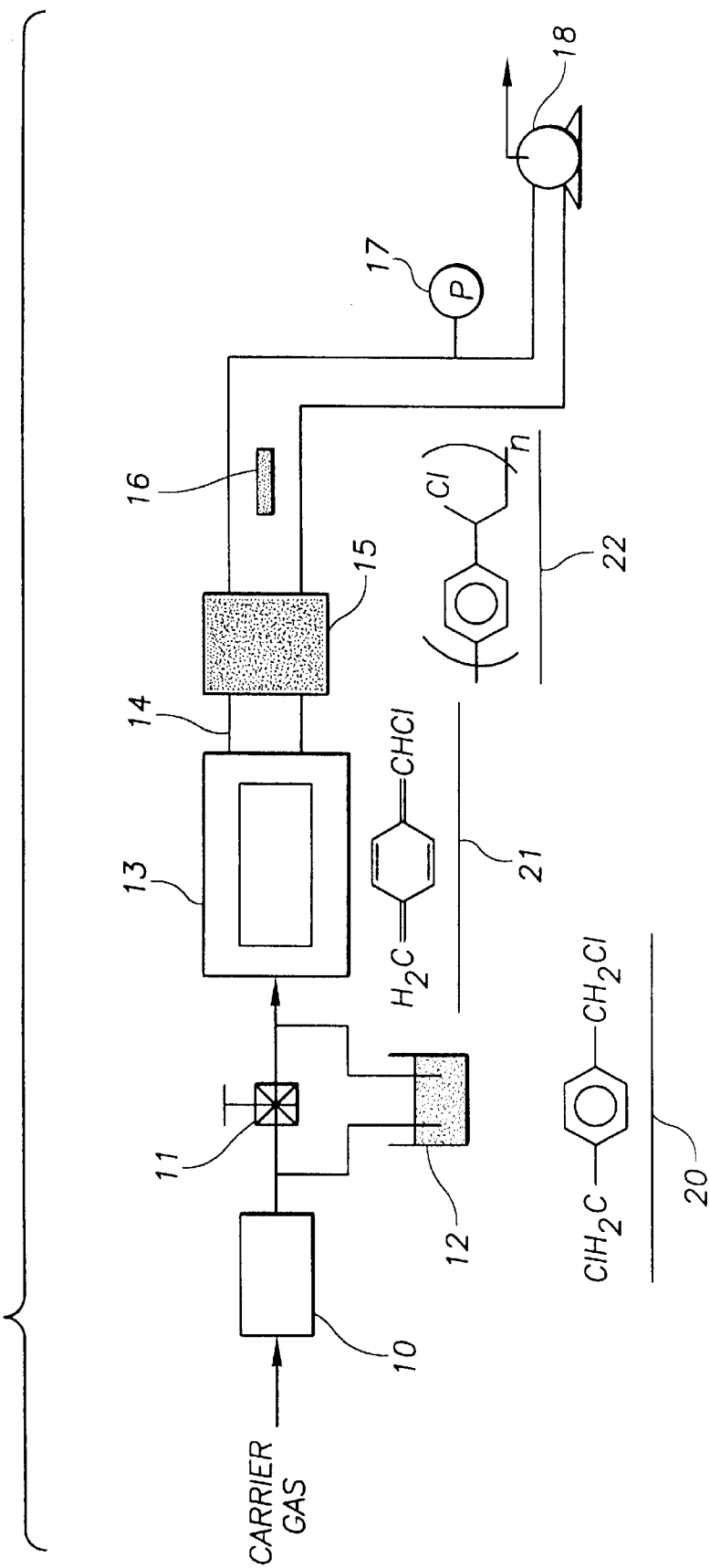
FIG. 1 is a schematic illustration of a typical CVD apparatus.

Once a suitable substrate has been prepared, a polymer or polymer precursor is selectively deposited thereon by CVD to produce a patterned layer. A schematic of a typical CVD apparatus is given in FIG. 1.

A carrier gas (such as argon) is passed through a mass flow controller 10 to control its flow rate. When a valve 11 is closed, the carrier gas is passed through a monomer bath 12. A typical monomer for this bath when depositing a PPV precursor is $\alpha$-$\alpha$' dichloro p-xylene 20. The carrier gas, now saturated with monomer vapor, then passes into a pyrolysis furnace 13, where the monomer is converted into a reactive intermediate monomer. In the case of a starting monomer of $\alpha$-$\alpha$' dichloro p-xylene, the reactive monomer is 7-chloro-1,4-quinodimethane 21. The gas, now saturated with a mixture of the starting monomer and the reactive monomer, then passes through heated gas transport lines 14, and through a cold trap 15, which preferentially condenses out the starting monomer. A substrate 16 is kept at a temperature below the critical condensation temperature of the reactive monomer, so that it will condense on its surface. A condensation polymerization reaction occurs at the substrate surface, depositing a polymer layer thereon. For the example starting monomer of $\alpha$-$\alpha$' dichloro p-xylene, the deposited polymer layer is a chlorinated precursor 22 of PPV. Optionally, it is possible to deposit one or more monomers on the surface of the substrate, and then to polymerize the monomer in later processing.

After the layer has been deposited, the gas passes by a pressure gauge 17 which is used to monitor the deposition process, and finally into a roughing pump 18.

Typical operating pressures and temperatures, carrier gases, and deposition times for chemical vapor deposition of polymers are dependent upon the polymer to be deposited and the monomer used. Preferred values for these deposition parameters are given in the Examples for the deposition systems disclosed therein, but it will be clear to those skilled in the art that the preferred values may differ substantially for other systems. It is well-known to use known parameters such as vapor pressure and critical temperature of the monomer to determine optimum values for the deposition parameters without undue experimentation.

After selective deposition has been achieved, the selectively coated substrate may be subject to further processing. If the material deposited is a polymer precursor, thermal or other treatment may be necessary to convert the precursor into the desired polymer. Deposition of organometallic substances or organic dyes may be accomplished using the same CVD apparatus, either before or after selective deposition of the polymer or polymer precursor. A protective layer of another polymer or other substance may be deposited while the selectively deposited polymer is still subject to the controlled conditions of the CVD chamber. For the particular case of the deposition of PPV precursor, deposition of such other materials in the same CVD chamber has the advantage that the precursor need not be exposed to oxygen which may encourage the formation of carbonyl defects, and that the PPV need not be exposed to oxygen or moisture, both of which have been found to have a deleterious effect on its electronic properties.

EXAMPLE 1

This example illustrates the selective enhancement of nucleation of $\alpha\text{-}\alpha'$ dichloro p-xylene on a gold substrate stamped with self-assembled monolayers of $HS(CH_2)_{15}COOH$.

A gold substrate was prepared by physical vapor deposition of gold onto a silicon wafer which had first been coated with a titanium adhesion layer. The substrate was then stamped with a pattern of 30 µm dots of self-assembled monolayers of $HS(CH_2)_{15}COOH$ alkane-thiol. The stamping was accomplished according to the procedures set forth in U.S. Pat. No. 5,512,131.

After stamping, the substrate was dipped in liquid $HS(CH_2)_{15}CH_3$, to "backwash" the rest of the surface. This process deposited $HS(CH_2)_{15}CH_3$ in the regions which did not contain $HS(CH_2)_{15}COOH$, resulting in a structure in which circular regions of $HS(CH_2)_{15}COOH$ were disposed in a "background" region of $HS(CH_2)_{15}CH_3$.

The substrate was then subjected to chemical vapor deposition of the $\alpha\text{-}\alpha'$ dichloro p-xylene monomer. As the monomer was deposited, it built precursor polymers by a condensation-polymerization reaction. The CVD process for forming unselective coatings of PPV has been described in detail in "Chemical Vapor Deposition of Thin Polymer Films Used in Polymer-Based Light Emitting Diodes," *Advanced Materials* 9(6) pp 490–493 (1997), and "Chemical vapor deposition of poly(p-phenylene vinylene) based light emitting diodes with low turn-on voltages," *Applied Physics Letters* 77 (October 1997), which are incorporated herein by reference in their entirety. The deposition was achieved as described in the latter reference: the monomer was placed in a glass tube heated to 60° C., and transported at a pressure of 0.1 Torr to the furnace by an Ar carrier gas. Pyrolosis was accomplished at 625° C. to convert the monomer to the reactive monomer. In order to minimize the deposition of polymer on the walls of the system, the gas transport lines were heated to 95° C. The substrate was held at a temperature of 25° C. The film deposition rate was about 10 Å/s.

Figure 2A:
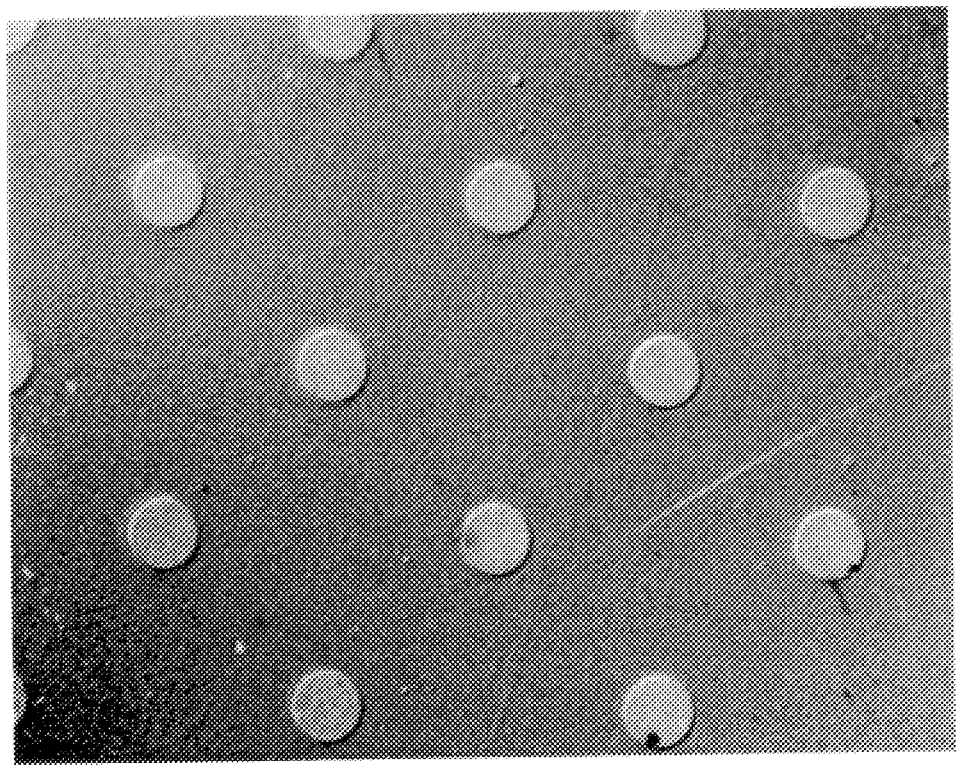
FIGS. 2a and 2b are photomicrographs at 20× and 100× of the patterned PPV layer of Example 1.
Figure 2B:
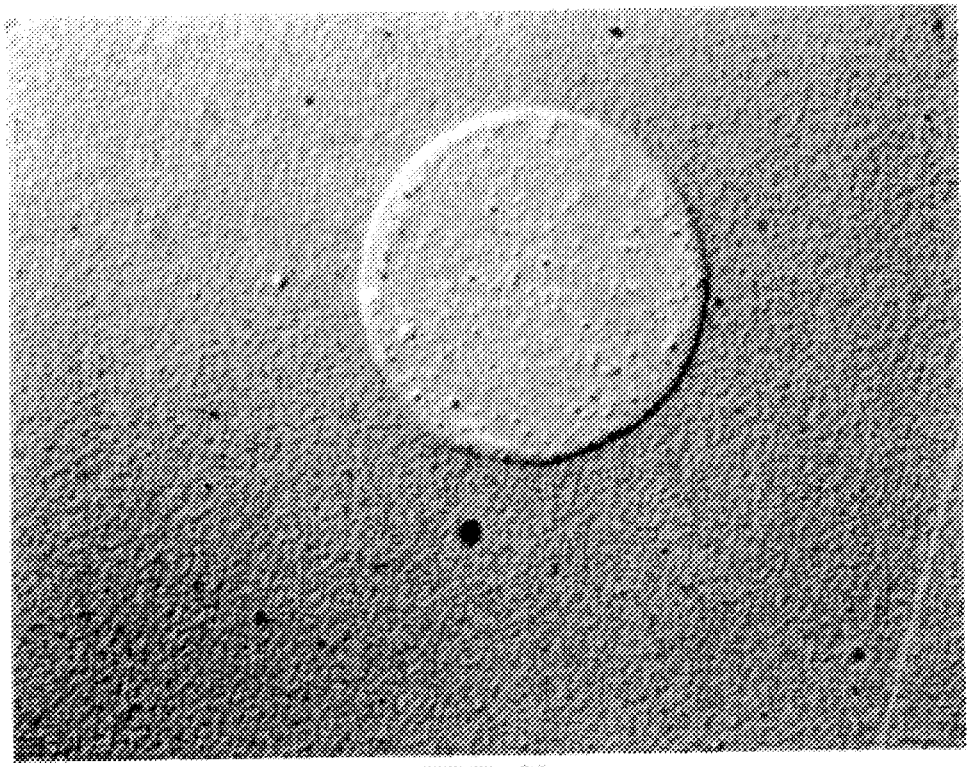

Upon completion of the deposition process, the substrate had been coated with a patterned film, in which the thickness of the PPV precursor polymer was much greater in the round areas which had been treated with $HS(CH_2)_{15}COOH$ than in the areas containing $HS(CH_2)_{15}CH_3$. The precursor patterned film was then heated to 300° C. in an argon atmosphere at 0.1 torr to convert the precursor into PPV. The final result was a patterned PPV film. FIGS. 2a and 2b show photomicrographs of the PPV film as seen by optical microscopy at 20× and 100× respectively. The sharply defined dots of thicker PPV area are clearly visible. Overall film thickness was about 900 Å, and the dots were elevated 200 Å above the background.

EXAMPLE 2

This example illustrates the selective enhancement of nucleation of ($\alpha\text{-}\alpha'$ dibromo p-xylene on a gold substrate stamped with self-assembled monolayers of $HS(CH_2)_{15}COOH$.

The substrate was prepared by the same method as the substrate of Example 1.

The brominated monomer was deposited under the same conditions as the chlorinated monomer described in Example 1. Selective deposition to form a patterned layer of the brominated precursor film occurred, but with somewhat less inhibition than was observed for the chlorinated monomer. For a film thickness of about 900 Å, the dots were elevated about 100 Å above the background.

EXAMPLE 3

This example illustrates the selective inhibition of nucleation of $\alpha\text{-}\alpha'$ dichloro p-xylene on a silicon substrate which has been subjected to abrasion with a metal tool.

The substrate was a portion of a standard [100] 8" silicon wafer. Before deposition, half of the wafer surface was scraped with a plain-carbon steel razor blade. The wafer was then subjected to chemical vapor deposition of $\alpha\text{-}\alpha'$ dichloro p-xylene to form a precursor layer as described in Example 1. The precursor layer was formed only on the region of the substrate which had not been scraped with the razor blade.

EXAMPLE 4

This example illustrates the selective inhibition of nucleation of $\alpha\text{-}\alpha'$ dichloro p-xylene on a glass substrate which has been dipped in a solution of $FeSO_4$.

Figure 3:
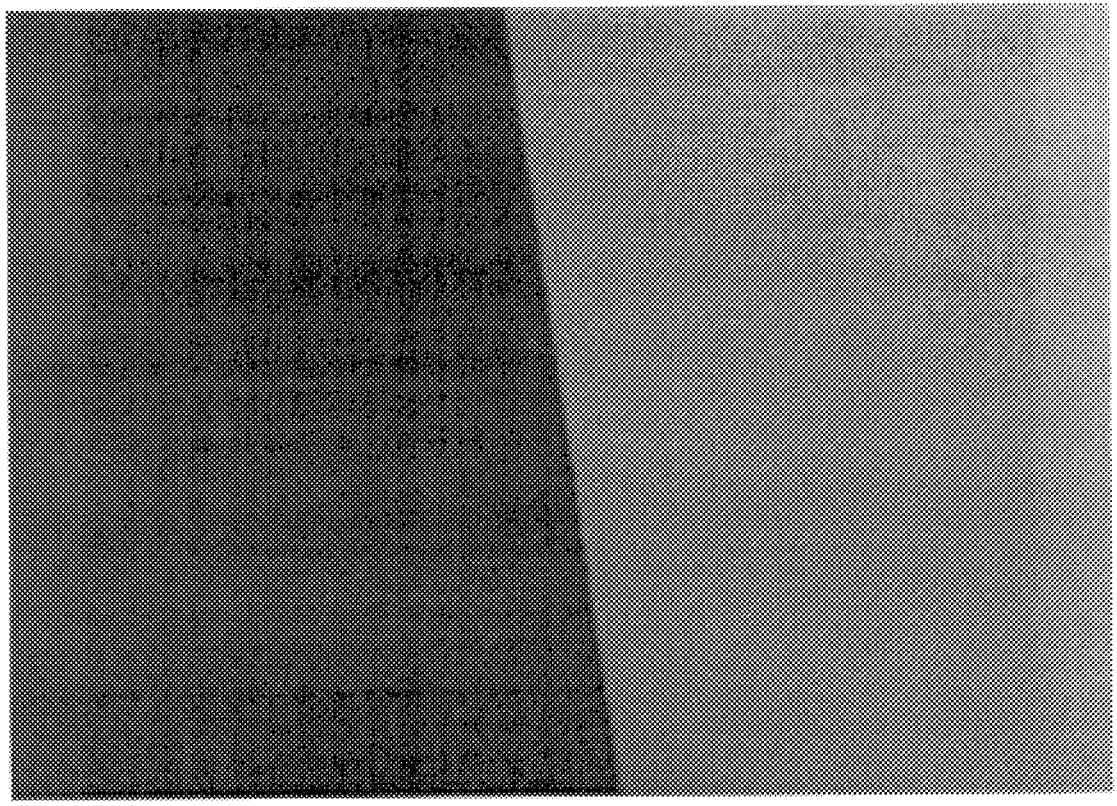
FIG. 3 is a photomicrograph of the patterned PPV layer of Example 4.

The substrate was a silicon chip as in Example 3. Before deposition, the slide was dipped partially into a 0.2 g/mL solution of $FeSO_4$ to coat approximately half of the surface. Deposition was accomplished as described in Example 1. The substrate was then thermally treated as described in Example 1 to convert the deposited precursor layer to PPV. The result was a patterned layer of PPV, which was present only on the areas of the substrate which had not been exposed to the $FeSO_4$. FIG. 3 shows a photomicrograph of the PPV layer. Light areas represent PPV, while dark areas represent uncoated substrate.

EXAMPLE 5

This example illustrates the selective inhibition of nucleation of $\alpha\text{-}\alpha'$ dichloro p-xylene on a gold substrate stamped with self-assembled monolayers of $HS(CH_2)_{15}COOH$ and further exposed to $FeSO_4$.

The substrate was a silicon wafer which had been coated with gold by physical vapor deposition using techniques which will be apparent to those skilled in the art. A pattern of $HS(CH_2)_{15}COOH$ dots in a $HS(CH_2)_{15}CH_3$ background was stamped onto the surface as described in Example 1. The substrate was then dipped in a 0.2 g/mL solution of $FeSO_4$. The solution reacted with the $HS(CH_2)_{15}COOH$ by ion exchange to form $(HS(CH_2)_{15}COO-)_2Fe^{2+}$ in the dot regions. The substrate was then rinsed with deionized water to remove iron ions from the $HS(CH_2)_{15}CH_3$ regions.

Figure 4:
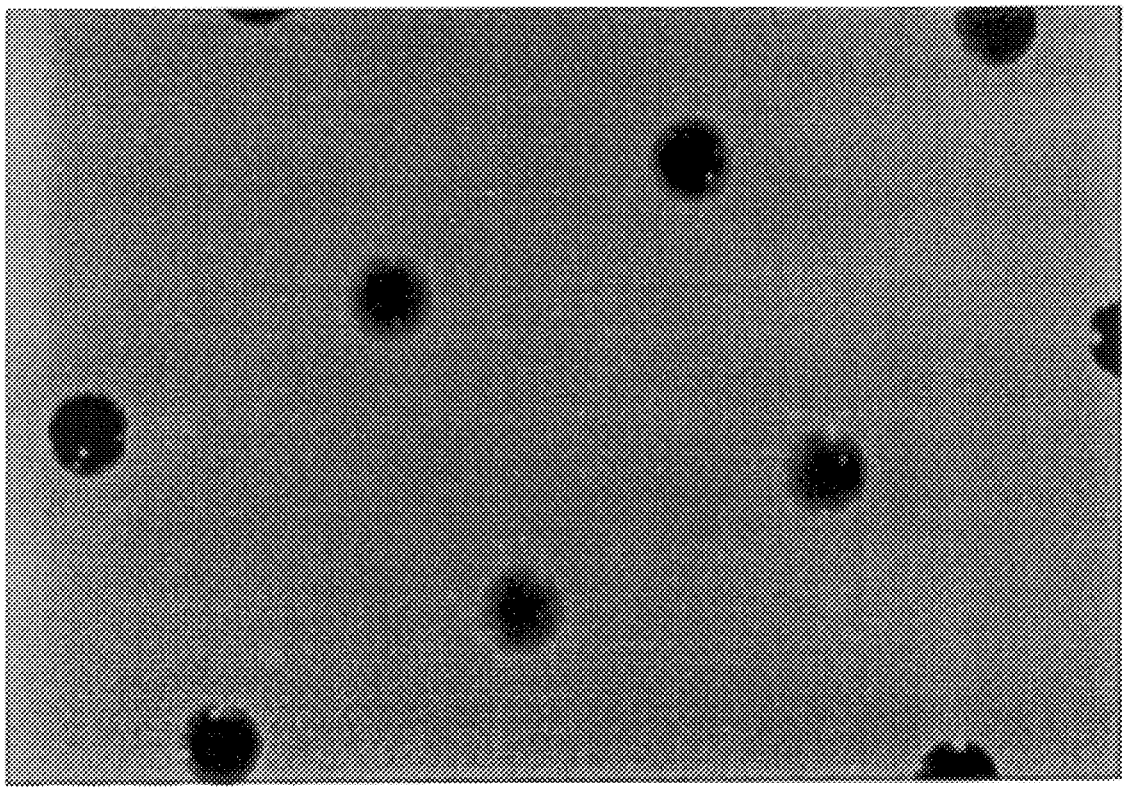
FIG. 4 is a photomicrograph of the patterned PPV layer of Example 5.

When the prepared substrate was subjected to the deposition process of Example 1, it was found that the PPV precursor had deposited on the $HS(CH_2)_{15}CH_3$ regions, but not on the $(HS(CH_2)_{15}COO-)_2Fe^{2+}$ dots, creating a patterned layer of the precursor polymer. The substrate was then subjected to the thermal treatment of Example 1 to convert the precursor layer into PPV. FIG. 4 shows a photomicrograph of the resulting patterned layer of PPV. Light areas represent PPV, and dark areas represent uncoated substrate.

EXAMPLE 6

This example will illustrate the selective enhancement of nucleation of 1,4 dichloro methyl benzene on a substrate by the selective deposition of an organic layer adapted to enhance the nucleation.

The substrate may be gold or silver, or any other material which can be effectively selectively coated with a suitable organic layer. Deposition is accomplished similarly to the deposition of Example 1, but using the 1,4 dichloro methyl benzene monomer to form a precursor polymer to poly (phenylene acetylene), an electroluminescent polymer. Conversion of the precursor to the final desired polymer is again accomplished by a heat treatment subsequent to the chemical vapor deposition step.

EXAMPLE 7

This example will illustrate the construction of an electronic device comprising a patterned layer of PPV.

A substrate coated with ITO, and further coated with SAMs as described in Example 5, is subjected to chemical vapor deposition of α-α' dichloro p-xylene to produce a patterned layer of a PPV precursor polymer. While the substrate is still in the CVD apparatus in a substantially oxygen-free atmosphere, it is thermally treated to convert the PPV precursor into PPV. The substrate is then further coated with an electron transporting layer such as tris(8-hydroxyquinoline) aluminum ($Alq_3$), for example by physical vapor deposition. An electrode material such as aluminum is then selectively deposited using techniques known to those skilled in the art. A further protective layer of a transparent substance may optionally be deposited after the deposition of the electrode to protect the PPV layer from moisture and oxygen exposure. Upon passing current through this device, the PPV will glow green in the pattern defined by the original SAM pattern stamped onto the substrate.

EXAMPLE 8

This example will illustrate the selective deposition of both PPV and an organic dye to produce an electroluminescent device.

The surface of an ITO substrate as described in Example 7 is coated with $FeSO_4$ as described in Example 4. The substrate is then selectively coated with at least one organic dye, for example, by physical vapor deposition with a shadow mask to produce a patterned layer of dye. Optionally, several dyes may be used in a series of depositions with different shadow masks. The substrate is then subjected to chemical vapor deposition of α-α' dichloro p-xylene monomer. The monomer will nucleate preferentially on dye areas to produce a patterned layer of a PPV precursor polymer, where PPV and organic dye have been selectively deposited on substantially the same areas of the substrate. The substrate is then coated with an electron transport layer, an electrode, and optionally with a protective layer as described in Example 7. When current is passed through the resulting device, the selectively coated regions glow in the characteristic color(s) of the organic dye(s), rather than in the characteristic green of PPV.

EXAMPLE 9

This example will illustrate the selective deposition of PPV in the production of a "regular" electroluminescent device.

An ITO substrate coated with $FeSO_4$ is produced as described in Example 8. A hole-transporting organic dye such as N, N' diphenyl N, N' bis(3-methyl phenyl) 1-1' biphenyl 4, 4' diamine (TPD) is then selectively deposited on the surface, for example by physical vapor deposition with a shadow mask. The substrate is then subjected to chemical vapor deposition of α-α' dichloro p-xylene monomer. The monomer will nucleate preferentially on dye areas to produce a patterned layer of a PPV precursor polymer, where PPV and organic dye have been selectively deposited on substantially the same areas of the substrate. Patterned layers of at least one of an electron transport material such as $Alq_3$ and an electrode material such as aluminum can then be deposited, where these layers are patterned in such a way as to address PPV pixels, as will be apparent to those skilled in the art. The result is a regular device in which pixels can be selectively addressed.

EXAMPLE 10

This example will illustrate a technique for using a block copolymer to prepare a surface which is selectively patterned with PPV.

A substrate such as silicon, gold, or ITO is coated with a phase-separating block copolymer, which comprises iron in one of the blocks. The phase separation of this polymer will produce a surface characterized by regions of the iron-containing block and regions of the iron-free block. When such a substrate is subjected to chemical vapor deposition according to the technique of Example 1, the PPV precursor polymer will form in the iron-free regions preferentially. Subsequent heat treatment as described in Example 1 will produce a patterned layer of PPV.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method of selective inhibition of growth by chemical vapor deposition of a precursor polymer of poly(p-phenylene vinylene) or a poly(p-phenylene vinylene) derivative on a substrate, the method comprising surface treatment of the CVD substrate before deposition, the surface treatment adapted to inhibit nucleation of the precursor in one or more regions of the substrate without the use of plasma processing.

2. The method of claim 1, wherein the surface treatment comprises stamping self-assembled monolayers.

3. The method of claim 2, wherein the stamping is followed by solution processing to effect ion exchange on at least a portion of the substrate surface.

4. The method of claim 1, wherein the surface treatment comprises exposing the substrate surface to at least one of the group consisting of metal shavings and metal salts.

5. The method of claim 4, wherein the surface treatment comprises exposing the substrate surface to at least one of the group consisting of iron shavings, iron sulfate, copper sulfate, and silver sulfate.

6. The method of claim 1, wherein the surface treatment comprises scraping the surface with a metal tool.

7. The method of claim 1, wherein the substrate surface is selected from the group consisting of indium-tin oxide, glass, silicon, silver, gold, and aluminum.

8. A method of selective inhibition of growth by chemical vapor deposition of a precursor polymer of poly(p-phenylene vinylene) or a poly(p-phenylene vinylene) derivative on a substrate, the method comprising surface treatment of the CVD substrate before deposition, the surface treatment adapted to inhibit nucleation of the precursor in one or more regions of the substrate.

9. The method of claim 8, wherein the surface treatment comprises stamping self-assembled monolayers.

10. The method of claim 8, wherein the surface treatment comprises exposing the substrate surface to at least one of the group consisting of metal shavings and metal salts.

11. The method of claim 10, wherein the surface treatment comprises exposing the substrate surface to at least one of the group consisting of iron shavings, iron sulfate, and copper sulfate.

12. The method of claim 8, wherein the surface treatment comprises scraping the surface with a metal tool.

13. The method of claim 8, wherein the substrate surface is selected from the group consisting of indium-tin oxide, glass, silicon, silver, gold, and aluminum.

14. A method of selective enhancement of growth by chemical vapor deposition of a precursor polymer of poly(p-phenylene vinylene) or a poly(p-phenlylene vinylene) derivative on a substrate, the method comprising surface treatment of the CVD substrate before deposition, the surface treatment adapted to promote nucleation of the precursor in one or more regions of the substrate.

15. The method of claim 14, wherein the surface treatment comprises priming the substrate with an organic layer.

16. The method of claim 15, wherein the organic layer comprises COOH.

17. The method of claim 15, wherein the organic layer comprises poly(vinyl carbazole).

18. The method of claim 14, wherein the substrate surface is selected from the group consisting of indium-tin oxide, glass, silicon, silver, gold, and aluminum.

19. A method of making an electronic device comprising electroluminescent polymers, the method comprising one or more of (i) selective enhancement of the growth by chemical vapor deposition of a precursor polymer of poly(p-phenylene vinylene) or a poly(p-phenylene vinylene) derivative on a substrate by surface treatment of the CVD substrate, the surface treatment adapted to promote nucleation of the precursor in one or more regions of the substrate, and (ii) selective inhibition of the growth by chemical vapor deposition of a precursor polymer of poly(p-phenylene vinylene) or a poly(p-phenylene vinylene) derivative on a substrate by surface treatment of the CVD substrate, the surface treatment adapted to inhibit nucleation of the precursor in one or more regions of the substrate.

20. The method of claim 19, wherein the method further comprises a thermal conversion step adapted to transform the precursor polymer into poly(p-phenylene vinylene) or a poly(p-phenylene vinylene) derivative.

21. The method of claim 19, wherein the surface treatment comprises stamping a self-assembled monolayer.

* * * * *